(12) United States Patent
Kim

(10) Patent No.: US 8,766,405 B2
(45) Date of Patent: Jul. 1, 2014

(54) SEMICONDUCTOR DEVICE AND METHOD OF MANUFACTURING THE SAME

(75) Inventor: Dong Seok Kim, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 30 days.

(21) Appl. No.: 13/471,241

(22) Filed: May 14, 2012

(65) Prior Publication Data

US 2013/0093056 A1    Apr. 18, 2013

(30) Foreign Application Priority Data

Oct. 14, 2011   (KR) .................. 10-2011-0105471

(51) Int. Cl.
 *H01L 27/06*   (2006.01)

(52) U.S. Cl.
 USPC ............. 257/536; 257/E21.004; 257/E27.016

(58) Field of Classification Search
 USPC ........... 438/384; 257/E21.004, 536, E27.016, 257/E21.575
 See application file for complete search history.

(56) References Cited

U.S. PATENT DOCUMENTS 7,633,373 B1 * 12/2009 Johnson et al. ............... 338/195

FOREIGN PATENT DOCUMENTS

| KR | 1020110078927 | 7/2011 |
|---|---|---|
| KR | 1020110078953 | 7/2011 |

OTHER PUBLICATIONS

Korean Intellectual Property Office (KIPO), English Abstract for Korean Patent Application No. 1020090135850; Patent Publication No. 1020110078927, Jul. 7, 2011, http://kpa.kipris.or.kr/XML/201100078927A0/kpa.xl.
Korean Intellectual Property Office (KIPO), English Abstract for Korean Patent Application No. 1020090135882; Patent Publication No. 1020110078953, Jul. 7, 2011, http://kpa.kipris.or.kr/XML/201100078953A0/kpa.xl.
Korean Intellectual Property Office (KIPO), Notice of Allowance for Korean Patent Application No. 1020110150471, Apr. 24, 2013.

\* cited by examiner

*Primary Examiner* — Zandra Smith
*Assistant Examiner* — Paul Patton
(74) *Attorney, Agent, or Firm* — Murabito Hao & Barnes LLP; Andrew D. Fortney

(57) ABSTRACT

Provided is a semiconductor device. The semiconductor device includes a first insulation layer on a semiconductor substrate, the first insulation layer including a lower metal line, a second insulation layer on the first insulation layer, the second insulation layer including a metal head pattern, a thin film resistor pattern on the metal head pattern, a third insulation layer on the thin film resistor pattern, an upper metal line on the third insulation layer, a first via passing through the first, second, and third insulation layers to connect the lower metal line to the upper metal line, and a second via passing through the third insulation layer and the thin film resistor pattern to connect the metal head pattern to the upper metal line.

20 Claims, 6 Drawing Sheets

SEMICONDUCTOR DEVICE AND METHOD OF MANUFACTURING THE SAME

CROSS-REFERENCE TO RELATED APPLICATIONS

This application claims priority under 35 U.S.C. §119 to Korean Patent Application No. 10-2011-0105471, filed Oct. 14, 2011, which is hereby incorporated by reference.

BACKGROUND

Passive devices perform important functions in an electronic system. Recently, the making of miniaturized, multifunctional, and economical electronic appliances has gained popularity and given rise to requirements for passive devices to be fabricated in the form of an array, a network, and a built-in passive device. Such passive devices sense, monitor, transmit, reduce, and control voltage.

Resistors as passive devices may suppress a flow of electric charge current, thereby controlling the amount of current. Such passive devices may be classified as a thin film resistor, in which a metal layer is thinly deposited to form a pattern, and an active layer resistor using an active layer area. Among these, the thin film resistor is generally positioned between metal lines of a semiconductor device.

FIGS. 1 and 2 are sectional views of a semiconductor device including a thin film resistor pattern according to the related art. Referring to FIG. 1, a semiconductor device includes a first insulation layer 21 disposed on a semiconductor substrate 10, lower metal lines 30 and 31 disposed on the first insulation layer 21, and a thin film resistor pattern 40 connecting the lower metal lines 30 and 31 to each other. FIG. 1 illustrates a simple process in which the thin film resistor pattern 40 is directly formed after the lower metal lines 30 and are formed. However, the thin film resistor pattern 40 is generally formed using a sputtering process. Thus, it is difficult to uniformly form the thin film resistor pattern 40 on edge portions of the lower metal lines 30 and 31 because the thin film resistor pattern 40 has a thickness of at least about an order of magnitude less than that of each of the lower metal lines 30 and 31. Thus, it is difficult to precisely form a thin film resistor by this process.

In the semiconductor device of FIG. 2, a thin film resistor head contact pattern 51 and a thin film resistor head pattern 52 are formed on a thin film resistor pattern 40, and the thin film resistor head pattern 52 and a via 71 are connected to each other. The semiconductor device of FIG. 2 a relatively complicated manufacturing process because four patterning and etching processes are required to form the thin film resistor 40, thin film resistor head contact pattern 51, thin film resistor head pattern 52, and via 71. Also, to prevent the thin film resistor pattern 40 from being damaged in the etching process, both dry and wet etching processes (oxide etch, HF-based) are performed. The HF-based process is used in a front end of the line (FEOL) process, but is not used in a back end of the line (BEOL) process. To prevent metallic contamination, equipment designated for patterning the thin film resistor is required.

Also, stress generated by a thermal expansion difference between the thin film resistor head pattern 52 and the thin film resistor pattern 40 may be increased as the thin film resistor head pattern 52 is increased in size. This may cause non-uniform resistance of the thin film resistor head pattern 52 and increase resistance dispersion.

SUMMARY

Embodiments of the present disclosure provide a semiconductor device including a thin film resistor pattern having a relatively stable resistance and a method of manufacturing the same.

In one embodiment, the semiconductor device may include a first insulation layer on a semiconductor substrate, the first insulation layer including a lower metal line; a second insulation layer on the first insulation layer, the second insulation layer including a metal head pattern; a thin film resistor pattern on the metal head pattern; a third insulation layer on the thin film resistor pattern; an upper metal line on the third insulation layer; a first via passing through the first, second, and third insulation layers to connect the lower metal line to the upper metal line; and a second via passing through the third insulation layer and the thin film resistor pattern to connect the metal head pattern to the upper metal line.

In the semiconductor device according to an embodiment, a trench may be defined in the metal head pattern, and the second via is connected to the metal head pattern in the trench. Thus, a contact interface between the metal head pattern and the second via may have a regular profile. The semiconductor device according to the present disclosure may have stable resistance characteristics, and also any mismatch of the resistances of the metal head pattern and the second via may be reduced, minimized, or eliminated.

Also, in the method of manufacturing the semiconductor device according to an embodiment, the metal head pattern may be formed prior to the thin film resistor pattern, to reduce stress due to a thermal expansion difference between the metal head pattern and the thin film resistor pattern, thereby forming a relatively stable thin film resistor.

The details of various embodiments are set forth in the accompanying drawings and the description below. Other features will be apparent from the description and drawings, and from the claims.

DETAILED DESCRIPTION

Hereinafter, semiconductor devices and methods of manufacturing the same according to embodiments of the present disclosure will be described with reference to the accompanying drawings.

Figure 1:
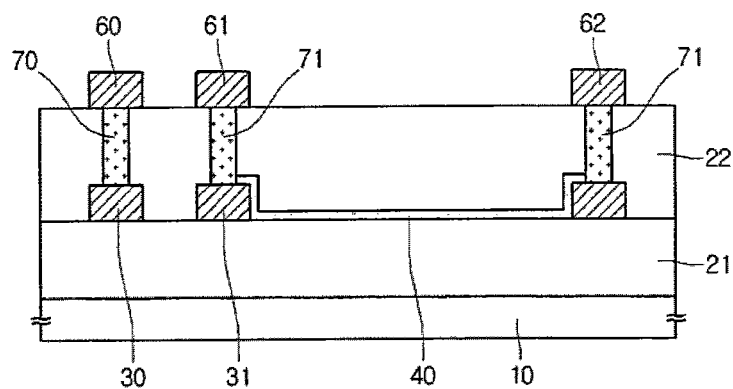
FIGS. 1 and 2 are cross-sectional views of a semiconductor device including a thin film resistor pattern according to the related art.
Figure 2:
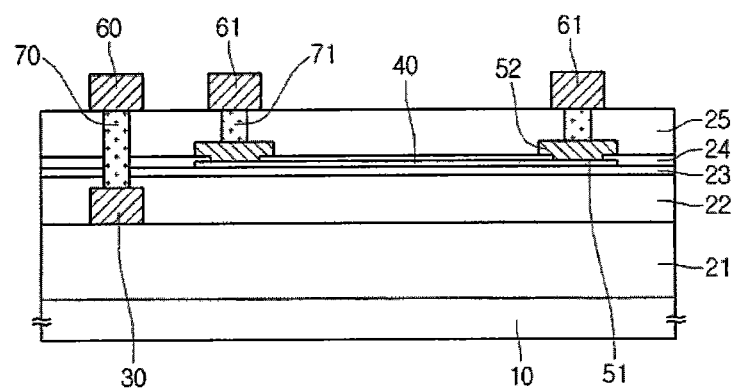
Figure 3:
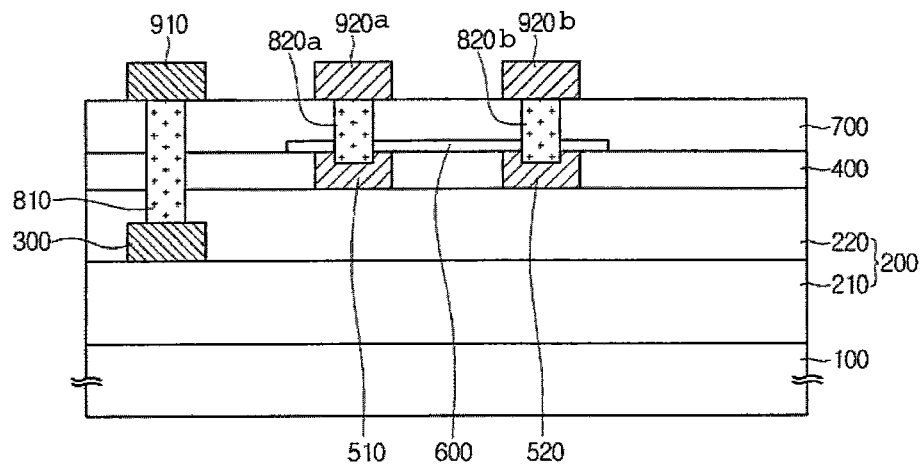
FIGS. 3 and 4 are cross-sectional views of a semiconductor device according to an embodiment of the present disclosure.
Figure 4:
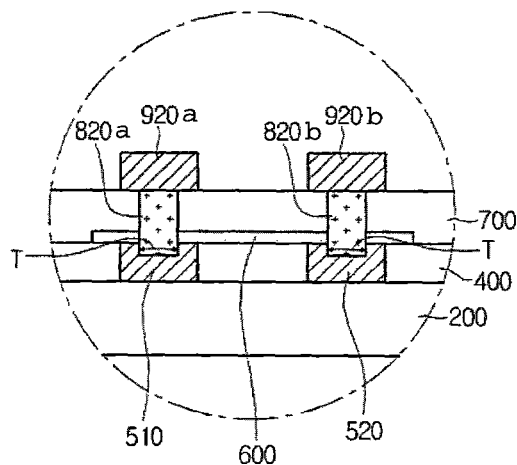

FIGS. 3 and 4 are cross-sectional views of a semiconductor device according to one embodiment of the present disclosure. FIGS. 5 to 15 are cross-sectional views illustrating various steps in a process of manufacturing a semiconductor device according to embodiments of the present disclosure.

Referring to FIG. 3, a semiconductor device according to an exemplary embodiment includes a first insulation layer 200 on a semiconductor substrate 100. In exemplary embodiments, the first insulation layer 200 includes a lower metal line 300. The semiconductor device also includes a second insulation layer 400 on the first insulation layer 200, including metal head patterns 510 and 520 formed therein. A thin film resistor pattern 600 is on the metal head patterns 510 and 520, and a third insulation layer 700 is on the thin film resistor pattern 600. The semiconductor device also includes upper metal lines 910 and 920a-b on the third insulation layer 700. A first via 810 passes through the first, second, and third insulation layers 200, 400, and 700, respectively, to connect the lower metal line 300 to the upper metal line 910; and second vias 820a-b passing through the third insulation layer 700 and the thin film resistor pattern 600 to connect the metal head patterns 510 and 520 to the upper metal lines 920a-b.

FIG. 4 is a detailed cross-sectional view of the metal head patterns 510 and 520, the thin film resistor pattern 600, and the second vias 820a-b according to an embodiment.

The metal head patterns 510 and 520 include a first metal head pattern 510 on the first insulation layer 200 and a second metal head pattern 520 on an area adjacent to the first metal head pattern 510. Although two metal head patterns 510 and 520 are illustrated in FIGS. 3 and 4, the present disclosure is not limited thereto. For example, two, three or more metal head patterns may be provided.

The metal head patterns 510 and 520 may comprise or consist essentially of at least one material selected from the group consisting of Ti, TiN, Al, Ta, TaN, W, Cu, and combinations thereof. Also, each of the metal head patterns 510 and 520 may have a width of about 0.1 µm to about 2 µm (e.g., 0.25 µm to 1.5 µm, 0.35 µm to 1.0 µm, or any value or range of values therein), but the present invention is not limited thereto.

Referring to FIGS. 3 and 4, the metal head patterns 510 and 520 and the second insulation layer 400 may have a same height or thickness as each other, but the present invention is not limited thereto. That is, each of the metal head patterns 510 and 520 may have a height or thickness less than that of the second insulation layer 400, and the second insulation layer 400 may cover the metal head patterns 510 and 520. Also, each of the metal head patterns 510 and 520 may have a trench T structure.

The thin film resistor pattern 600 is on the metal head patterns 510 and 520. In some embodiments, the thin film resistor patterns 600 may be formed between the first metal head pattern 510 and the second metal head pattern 520 (e.g., in a layout or top-down view).

Also, the thin film resistor pattern 600 may correspond to the metal head patterns 510 and 520. That is, the thin film resistor pattern 600 may vertically overlap the metal head patterns 510 and 520. For example, the thin film resistor pattern 600 may be formed to include areas in which the metal head patterns 510 and 520 are formed, but the present invention is not limited thereto.

The thin film resistor pattern 600 may include openings for exposing top surfaces of the metal head patterns 510 and 520. The entire top surfaces of the metal head patterns 510 and 520 or a portion of top surfaces of the metal head patterns 510 and 520 may be exposed by the openings. Also, the second vias 820a-b may be connected to the metal head patterns 510 and 520 through the openings.

As previously described above, a trench T may be formed in each of the metal head patterns 510 and 520. The trench T can be exposed by an opening in the thin film resistor pattern 600. Thus, each of the second vias 820a-b may be in or may extend into the trench T.

That is, in the semiconductor device according to an embodiment, each of the metal head patterns 510 and 520 may connect to the second vias 820a-b in the trench T. Thus, a contact interface between each of the metal head patterns 510 and 520 and the second vias 820a-b may have a regular (e.g., cup-shaped) profile. In addition, the semiconductor device according to an embodiment may have stable resistance characteristics, and a mismatch thereof (e.g., at the interface[s] between the second via[s] 820a-b, thin film resistor 600 and/or metal head pattern[s] 510/520) may be reduced, minimized, or eliminated.

FIGS. 5 to 15 are cross-sectional views illustrating an exemplary process of manufacturing a semiconductor device according to embodiments of the present disclosure. The manufacturing methods will be described with reference to the above-described semiconductor device.

Figure 5:
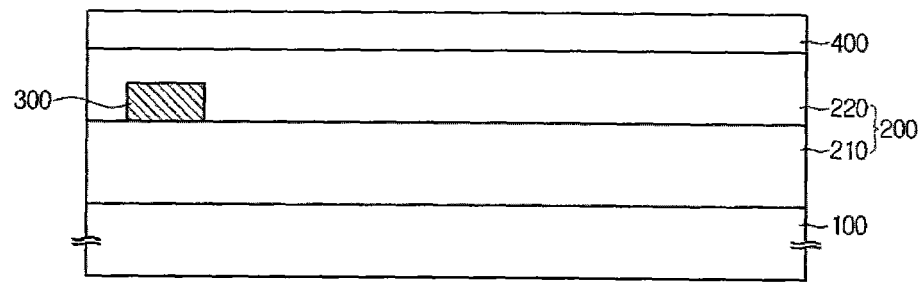
FIGS. 5 to 15 are cross-sectional views illustrating processes in manufacturing a semiconductor device according to an embodiment of the present disclosure.

Referring to FIG. 5, a first insulation layer 200, including a lower metal line 300, is formed on a semiconductor substrate 100. The first insulation layer 200 may comprise or consist essentially of an oxide layer (e.g., a silane-based silicon dioxide, which may be doped with [i] fluorine or [ii] boron and/or phosphorous, and formed by chemical vapor deposition from a silicon source such as silane or tetraethyl-orthosilicate (TEOS) and an oxygen source such as dioxygen [$O_2$] or ozone [$O_3$], etc.), but the disclosure is not limited thereto. For example, the first insulation layer 200 may further comprise a nitride (e.g., silicon nitride), an oxynitride (e.g., silicon oxynitride) or oxycarbide (e.g., SiOC or SiOCH), or any other suitable insulating material known in the art.

The first insulation layer 200 may have a thickness of about 5,000 Å to about 10,000 Å (e.g., 6,000 Å to 8,000 Å, or any value or range of values therein), and may be formed using any method known in the art. For example, in some embodiments, the first insulating layer 200 may be formed by chemical vapor deposition (CVD), which may be plasma-assisted, plasma-enhanced, or high density plasma (HDP) CVD. Thereafter, an etch back or chemical mechanical polishing process may be performed to planarize the first insulation layer 200.

Also, the first insulation layer 200 may be formed as a single layer or a plurality of layers (e.g., silicon nitride, silicon dioxide on silicon nitride, a silicon dioxide/fluorosilicate glass/silicon dioxide stack, etc.). For example, the first insulation layer 200 may include a first insulation sub-layer 210 and a second insulation sub-layer 220 on the semiconductor substrate 100. Here, the first insulation sub-layer 210 may be a pre-metal-dielectric (PMD), and the second insulation sub-layer 220 may be an inter metal dielectric (IMD). Although not shown in the figures, the first insulation layer 200 may include a plurality of metal patterns (not shown), but the disclosure is not limited thereto. The metal patterns (not shown) may be regularly or irregularly formed.

Figure 6:
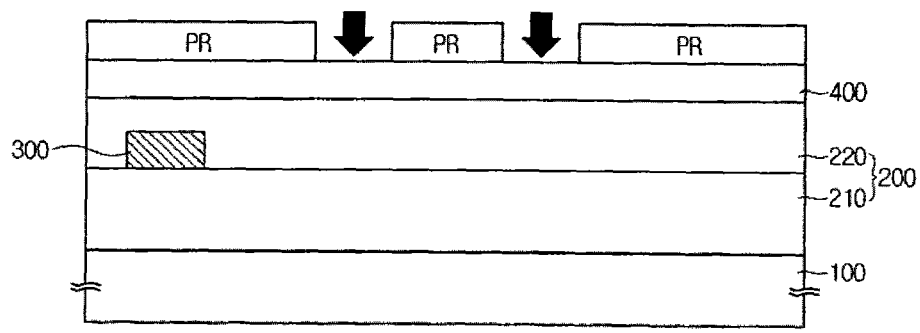
Figure 9:
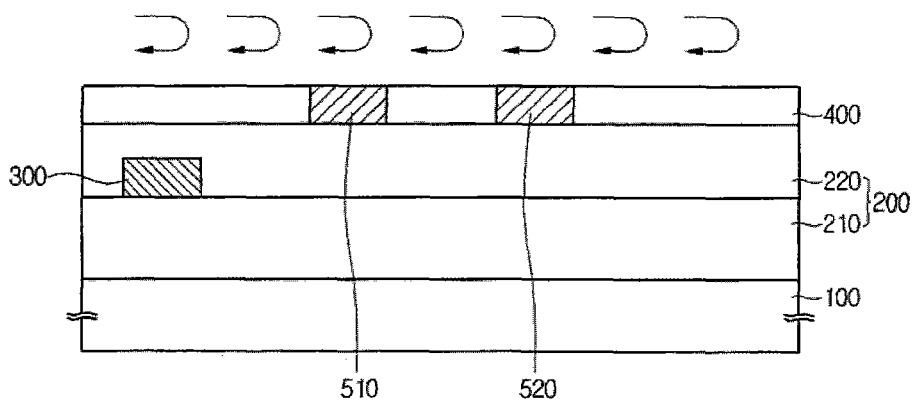

Referring to FIGS. 6 and 9, a second insulation layer 400, including metal head patterns 510 and 520, may be formed on the first insulation layer 200. For example, any suitable insulating material (e.g., silicon dioxide, silicon nitride, etc.) or combination of materials may be deposited on the first insulation layer 200 using any method known in the art (e.g., CVD, PVD, blanket deposition and patterning, etc.). The second insulation layer 200 may have a thickness of about 1,000 Å to about 5,000 Å, or any value or range of values therein.

Figure 7:
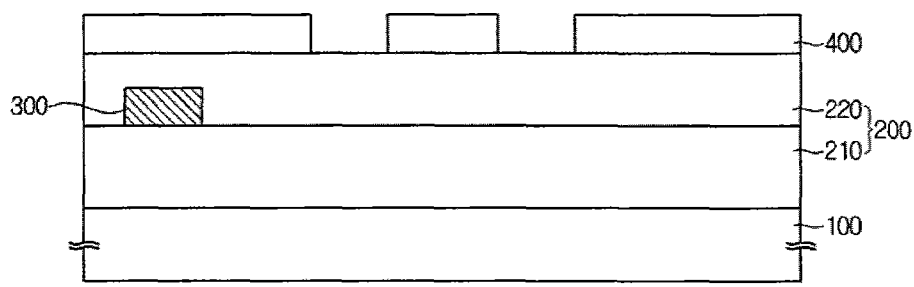

Referring to FIG. 6, a photoresist pattern PR having openings corresponding to areas in which the metal head patterns will be formed, is formed on the second insulation layer 400 using a photolithography process. Thereafter, as shown in FIG. 7, an etching process is performed to etch portions of the second insulation layer 400. Thereafter, the photoresist pattern (PR) is removed through an asking or stripping process.

Figure 8:
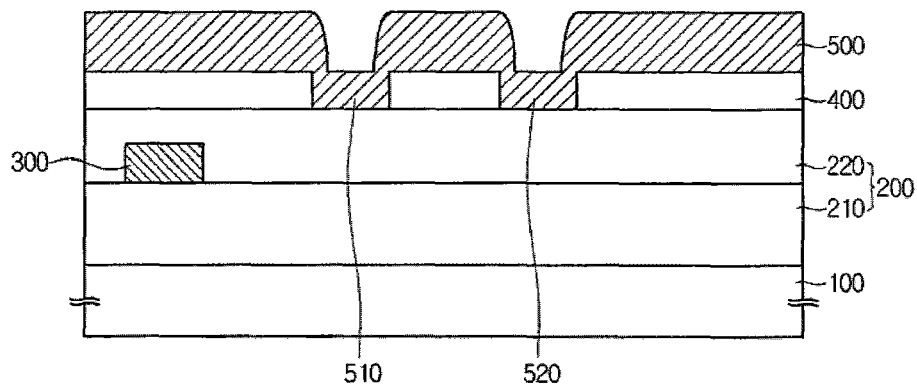

Sequentially, referring to FIG. 8, a metal head material 500 is deposited on the etched area of the second insulation layer 400. In the deposition process, the metal head material 500 may also be deposited on the etched second insulation layer 400. For example, the metal head material 500 may be formed by depositing at least one material selected from the group consisting of Ti, TiN, Al, Ta, TaN, W, Cu, and combinations, alloys, and conductive compounds thereof through physical vapor deposition (PVD), chemical vapor deposition (CVD), or any other suitable method known in the art. For example, in some embodiments, the metal head layer 500 may comprise tungsten, aluminum or an aluminum alloy (e.g., Al with up to 4 wt. % Cu, up to 2 wt. % Ti, and/or up to 1 wt. % Si), and may be deposited by sputtering or CVD on a conventional adhesion and/or barrier layer (e.g., Ti and/or TiN, such as a TiN-on-Ti bilayer). In another embodiment, the metal head layer 500 may comprise copper, electroplated on a TaN-on-Ta bilayer (which may have a thin Cu, Ru, Ta or other seed metal layer thereon).

Thereafter, referring to FIG. 9, a process for planarizing the metal head material 500 is performed. For example, an etch back process or a chemical mechanical polishing (CMP) process may be used as the planarization process. In the planarization process, the metal head material 500 deposited in areas other than the etched area of the second insulation layer 400 is removed, and only the metal head material 500 deposited in the etched area of the second insulation layer 400 remains.

Thus, the second insulation layer 400 including the metal head patterns 510 and 520 may be manufactured. The metal head patterns 510 and 520 may serve as an etch stop layer in an etching process for forming the first via 810 and the second vias 820a-b (FIGS. 3-4).

Figure 10:
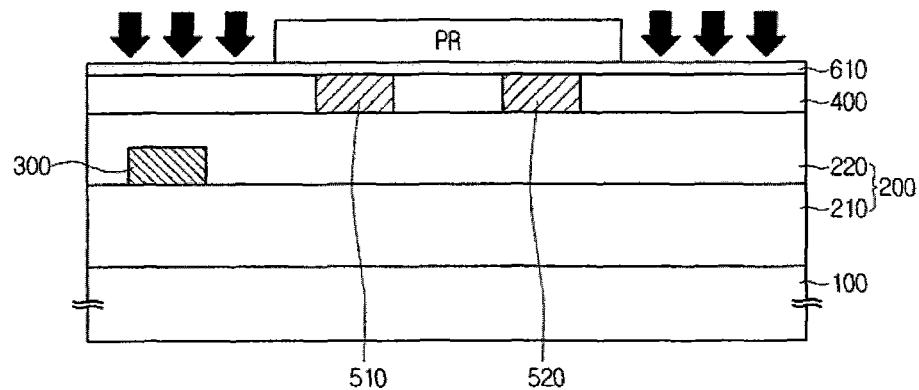
Figure 11:
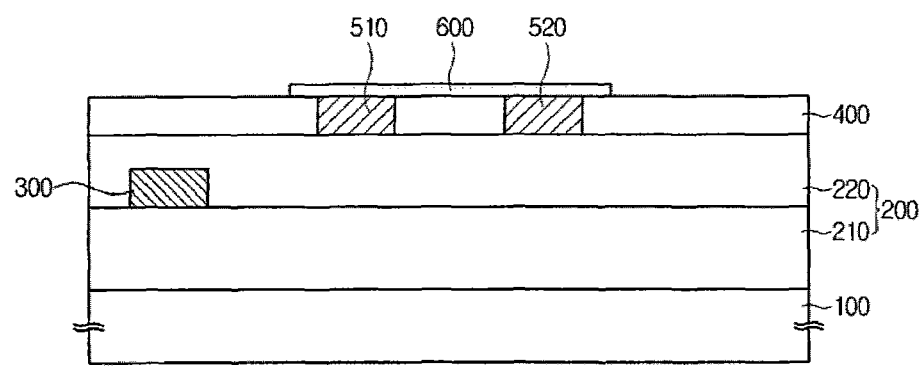

Referring to FIGS. 10 and 11, a thin film resistor pattern 600 is formed on the metal head patterns 510 and 520.

A thin film resistor material 610 may be deposited on the second insulation layer 400, including the metal head patterns 510 and 520, using any suitable method known in the art, and then portions of the thin film resistor material 610 may be etched to form the thin film resistor pattern 600 (FIG. 11).

Materials ordinarily used as thin film resistor in the art may be used as the thin film resistor material 610 without specific limitations. For example, the thin film resistor material 610 may comprise or consist essentially of at least one compound selected from the group consisting of CrSi, NiCr, TaN, $CrSi_2$, CrSiN, CrSiO, and combinations thereof, but the disclosure is not limited thereto. For example, the thin film resistor material 610 may be formed by depositing SiCr or NiCr on the second insulation layer 400 at a thickness of about 10 Å to about 1,000 Å (e.g., about 25 Å to about 500 Å, about 50 Å to about 400 Å, about 100 Å to about 350 Å, or any value or range of values therein) through a sputtering process.

Thereafter, a photoresist pattern (PR) is formed on the thin film resistor material 610, and then a photolithography process and an etching process may be performed to form the thin film resistor pattern 600.

The thin film resistor pattern 600 may vertically overlap the metal head patterns 510 and 520 under the thin film resistor pattern 600. That is, the thin film resistor pattern 600 may be formed to correspond to the metal head pattern 510 and 520. In some embodiments, the thin film resistor pattern 600 may be formed on the metal head patterns 510 and 520. For example, the thin film resistor pattern 600 may include and thus overlap areas in which the metal head patterns 510 and 520 are formed, but the present disclosure is not limited thereto.

In the method of manufacturing the semiconductor device according to various embodiments of the present disclosure, the metal head patterns 510 and 520 may be deposited prior to the thin film resistor pattern 600 to reduce stress due to a thermal expansion difference between the metal head patterns 510 and 520 and the thin film resistor pattern 600, thereby forming the relatively stable thin film resistor pattern 600.

Figure 12:
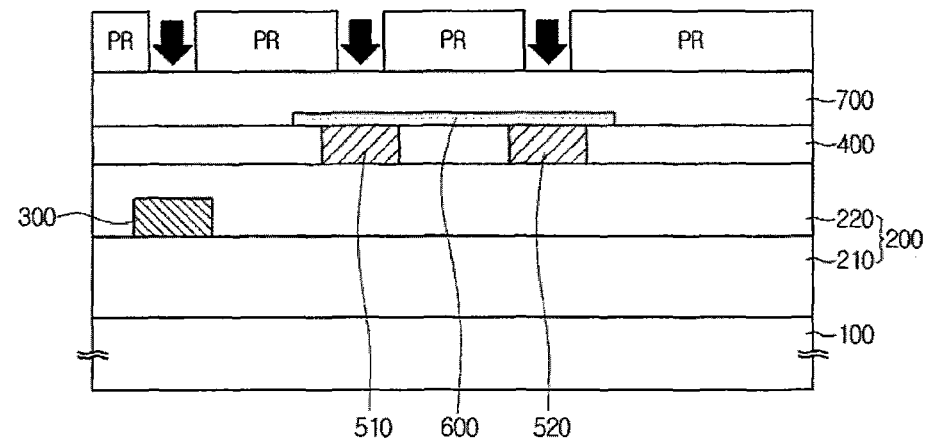
Figure 13:
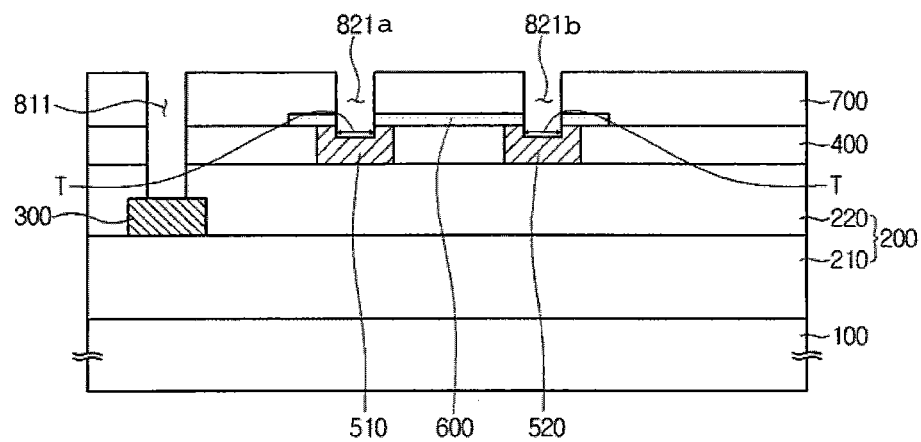

Referring to FIGS. 12 and 13, a third insulation layer 700 may be formed on the second insulation layer 400 and the thin film resistor pattern 600, and a portion of the third insulation layer 700 may be etched to form a first via hole 811 and second via holes 821a-b. The third insulation layer 700 may comprise or consist essentially of any suitable insulating material known in the art (e.g., silicon dioxide, which may be doped with [i] fluorine or [ii] boron and/or phosphorous, silicon nitride, combinations thereof, etc.), and can be formed using any method known in the art (e.g., CVD, PVD, blanket deposition and etching, etc.).

For example, a photoresist layer (PR) having openings corresponding to the lower metal line 300 and the metal head patterns 510 and 520 is formed on the third insulation layer 700, and a photolithography process and an etching process are performed. The third insulation layer 700, the second insulation layer 400, and a portion of the first insulation layer 200 are etched through the opening corresponding to the lower metal line 300 to form the first via hole 811 exposing a top surface of the lower metal line 300. Simultaneously, the third insulation layer 700 and the thin film resistor pattern 600 are etched through the opening corresponding to each of the metal head patterns 510 and 520 to form the second via hole 821 exposing each of the metal head patterns 510 and 520. In some embodiments, depending on the etch selectivity of thin film resistor material 610, one or more of the second via holes 820a-b may not completely penetrate the thin film resistor 600. In the process for forming the second via holes 821a-b (FIG. 14), a portion of each of the metal head patterns 510 and 520 may be etched to form the trench T, but the invention is not limited thereto. After the etching process is completed, the photoresist pattern PR is removed, for example, through an asking or stripping process.

Each of the first and second via holes 811 and 821a-b formed by the above-described method may have a width of about 0.5 μm or more and a depth of about 1,000 Å to about 9,000 Å.

Figure 14:
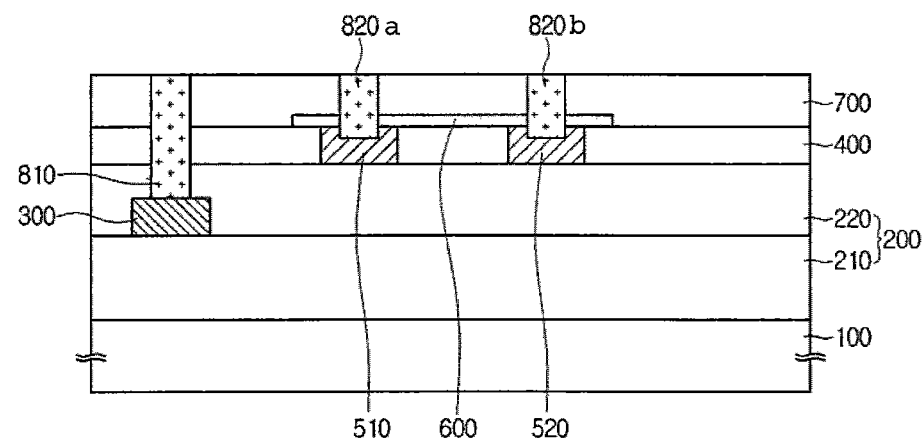
Figure 15:
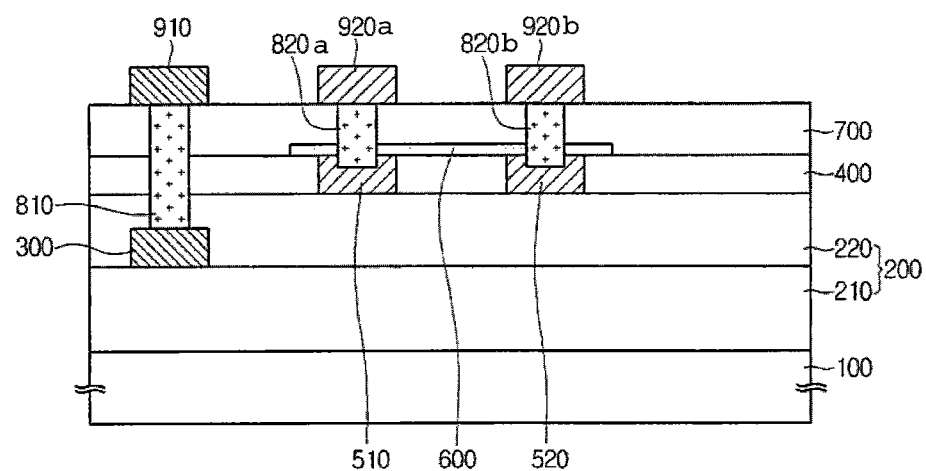

Referring to FIGS. 14 and 15, a metal material is deposited into the first and second via holes 811 and 821a-b to form a first via 810 and second vias 820a-b. The metal material may also be deposited into the trench T formed in each of the metal head patterns 510 and 520 to form the second vias 820a-b within the trench T. The metal material may comprise any conductive or conventional via material known in the art (e.g., tungsten, doped silicon, aluminum, copper, etc.), and the metal material may be deposited using any suitable method known in the art for depositing such metal material to form a via.

Thus, in the method of manufacturing the semiconductor device according to an embodiment, a contact interface between each of the metal head patterns 510 and 520 and the second vias 820a-b may have a regular profile. In addition, the semiconductor device according to the present disclosure may have relatively stable resistance characteristics, and also a mismatch thereof (e.g., at the interface[s] between the second via[s] 820a-b, thin film resistor 600 and/or metal head pattern[s] 510/520) may be reduced, minimized, or eliminated.

A planarization process may be additionally performed after the metal material is deposited, but the invention is not limited thereto. Sequentially, as shown in FIG. 15, upper metal lines 910 and 920a-b may be formed on the first and second vias 810 and 820a-b. The upper metal lines 910 and 920a-b may include various conductive materials such as metals, alloys and/or conductive compounds such as metal nitrides and/or silicides. For example, the upper metal lines 910 and 920a-b may include aluminum, copper, titanium, tungsten and the like. The upper metal lines 910 and 920a-b may be formed using any suitable method known in the art (e.g., blanket deposition and patterning). One portion of the upper metal line 910 may be connected to the lower metal line 300 through the first via 810, and another portion of the upper metal lines 920a-b may be connected to the metal head patterns 820a-b and the thin film resistor pattern 600 through the second vias 820a-b.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to affect such feature, structure, or characteristic in connection with other embodiments.

What is claimed is:

1. A method of manufacturing a semiconductor device, comprising:
   forming a first insulation layer comprising a lower metal line on a semiconductor substrate;
   forming a second insulation layer comprising a metal head pattern on the first insulation layer;
   forming a thin film resistor pattern on the metal head pattern;
   forming a third insulation layer on the thin film resistor pattern;
   forming a first via passing through the first, second, and third insulation layers and connected to the lower metal line, and simultaneously, forming a second via passing through the third insulation layer and the thin film resistor pattern and connected to the metal head pattern;
   forming a trench in an etched portion of the metal head pattern and depositing the via material into the trench; and
   forming an upper metal line on the third insulation layer.

2. The method according to claim 1, wherein forming the second insulation layer and the metal head pattern comprises:
   depositing the second insulation layer on the first insulation layer;
   etching a portion of the second insulation layer;
   depositing a metal head material on the etched second insulation layer; and
   planarizing the metal head material.

3. The method according to claim 2, wherein the metal head material comprises Ti, TiN, Al, Ta, TaN, W, Cu, or a combination, alloy, or conductive compound thereof, and the metal head material is deposited on the etched second insulation layer by physical vapor deposition or chemical vapor deposition.

4. The method according to claim 1, wherein forming the first and second vias comprises:
   forming a photoresist pattern comprising an opening corresponding to the lower metal line and the metal head pattern on the third insulation layer;
   etching the first, second, and third insulation layers to form a first via hole exposing the lower metal line;
   simultaneously etching portions of the third insulation layer, the thin film resistor pattern, and the metal head pattern to form a second via hole; and
   depositing a via material into the first and second via holes.

5. The method according to claim 4, wherein the first and second via holes have a width of about 0.5 µm or more, and a depth of about 1,000 Å to about 9,000 Å.

6. The method according to claim 4, further comprising planarizing the metal material.

7. The method according to claim 1, wherein forming the thin film resistor pattern comprises depositing a thin film resistor material on the second insulation layer and the metal head pattern, and etching a portion of the thin film resistor material.

8. The method according to claim 7, wherein the thin film resistor material comprises at least one material selected from the group consisting of CrSi, NiCr, TaN, $CrSi_2$, CrSiN, CrSiO, and combinations thereof.

9. The method according to claim 1, comprising connecting a first portion of the upper metal line to the lower metal line through the first via, and connecting a second portion of the upper metal line to the metal head pattern and the thin film resistor pattern through the second via.

10. The method according to claim 1, wherein the metal head pattern comprises a first metal head pattern on the first insulation layer and a second metal head pattern in an area adjacent to the first metal head pattern, and the thin film resistor pattern is between the first metal head pattern and the second metal head pattern.

11. The method according to claim 10, wherein the first metal head pattern and the second metal head pattern each have a width of 0.1 µm to 2 µm.

12. The method according to claim 11, wherein the first and second metal head patterns have a first thickness, and the second insulation layer has a second thickness equal to or greater than the first thickness.

13. The method according to claim 12, further comprising covering the first and second metal head patterns with the second insulating layer, when the second thickness is greater than the first thickness.

14. The method according to claim 1, wherein the thin film resistor pattern vertically overlaps the first and second metal head patterns.

15. The method according to claim 1, wherein the thin film resistor pattern has a thickness of about 10 Å to about 1,000 Å.

16. The method according to claim 1, further comprising forming a contact interface between the first and second metal head patterns and the second vias.

17. The method according to claim 1, further comprising planarizing the first insulation layer by an etch back or chemical mechanical polishing process.

18. The method according to claim 1, wherein the first insulation layer comprises a plurality of layers, including (i) a silicon oxide sub-layer, and (ii) a silicon nitride or fluorosilicate glass sub-layer.

19. The method according to claim 4, wherein forming the first and second vias comprises using the first and second metal head patterns as etch stop layers.

20. The method according to claim 18, wherein the first insulation layer includes a plurality of metal patterns.

* * * * *